United States Patent
Helgenberg et al.

(10) Patent No.: US 7,054,166 B1
(45) Date of Patent: May 30, 2006

(54) APPARATUS AND METHOD FOR EMI SHIELDING

(75) Inventors: John A. Helgenberg, Paoli, PA (US); Kenneth J. Neeld, West Chester, PA (US); Terry W. Louth, Narvon, PA (US)

(73) Assignee: Unisys Corporation, Blue Bell, PA (US)

( * ) Notice: Subject to any disclaimer, the term of this patent is extended or adjusted under 35 U.S.C. 154(b) by 38 days.

(21) Appl. No.: 10/727,757

(22) Filed: Dec. 3, 2003

(51) Int. Cl.
*H05K 9/00* (2006.01)

(52) U.S. Cl. ............... 361/816; 361/800; 174/35 R; 174/35 GC (58) Field of Classification Search ............... 361/800, 361/816, 818, 788, 796, 753, 799; 174/35 R, 174/35 GC
See application file for complete search history.

(56) References Cited

U.S. PATENT DOCUMENTS

| | | | | |
|---|---|---|---|---|
| H000526 | H * | 9/1988 | Miller ................... 361/818 |
| 5,204,496 | A * | 4/1993 | Boulay et al. ......... 174/35 GC |
| 5,233,507 | A * | 8/1993 | Gunther et al. ............ 361/818 |
| 5,278,351 | A * | 1/1994 | Herrick ................. 174/35 R |
| 5,354,951 | A * | 10/1994 | Lange et al. ............ 174/35 R |
| 5,783,771 | A * | 7/1998 | Copeland et al. ........ 174/35 R |
| 5,859,767 | A * | 1/1999 | Fontana ................. 361/818 |
| 5,913,583 | A * | 6/1999 | Zachoszcz ................ 312/263 |
| 6,043,992 | A * | 3/2000 | Scheibler ................ 361/818 |
| 6,044,540 | A * | 4/2000 | Fontana ................. 29/505 |
| 6,194,655 | B1 * | 2/2001 | Lange et al. ........... 174/35 GC |
| 6,390,320 | B1 * | 5/2002 | Hurst et al. ............ 220/241 |
| 6,621,717 | B1 * | 9/2003 | Tuttle et al. ............ 361/818 |
| 6,654,256 | B1 * | 11/2003 | Gough ................. 361/816 |
| 2002/0131259 | A1 * | 9/2002 | Rozy et al. ............. 361/818 |

\* cited by examiner

*Primary Examiner*—Kamand Cueno
*Assistant Examiner*—Dameon E. Levi
(74) *Attorney, Agent, or Firm*—Lisa A. Rode; Mark T. Starr; RatnerPrestia (57) ABSTRACT

A shield and method for inhibiting electromagnetic interference (EMI) emissions from an enclosure is disclosed. The shield includes a cover portion and a plurality of extensions adjacent the cover portion, the extensions together at least partially defining a channel extending along at least a portion of the cover portion, the channel having substantially parallel boundaries, the channel being configured to received a portion of the enclosure and to slidably engage the enclosure such that, when engaged, the cover portion inhibits electromagnetic interference emissions from the enclosure. The method includes aligning a plurality of extensions of a shield with a portion of the enclosure and sliding the extensions into engagement with the portion of the enclosure until the shield covers an opening in the enclosure, thereby inhibiting electromagnetic interference emissions from the enclosure through the opening.

11 Claims, 6 Drawing Sheets

APPARATUS AND METHOD FOR EMI SHIELDING

FIELD OF THE INVENTION

This invention relates to the field of electronics. In particular, this invention relates to EMI shielding for electronic assemblies.

BACKGROUND OF THE INVENTION

Electromagnetic interference (EMI) is inherent to electrical components. EMI emissions from electronic assemblies that house electrical components or are connected to electronic devices that contain electrical components can adversely affect the operation of other electronic assemblies and devices. Thus, methods, systems, and apparatus for inhibiting EMI emissions of electronic assemblies are useful.

Electronic assemblies often include an enclosure that defines a physical opening through which an electronic device is coupled to the electronic assembly. When an electronic device is coupled to the electronic assembly, the electronic device typically covers the opening through which it is connected, thereby inhibiting EMI emissions from that opening.

In some applications, there is a desire to provide an electronic assembly that is scalable for use with up to several electronic devices. The enclosure for such a scalable electronic assembly defines physical openings through which the electronic devices are coupled to the electronic assembly. These physical openings are a potential source of EMI emissions. When an electronic device is coupled to the electronic assembly at each opening, each electronic device typically covers the opening through which it is connected, thereby inhibiting EMI emissions from the openings. A problem arises when an opening is unused (e.g., when an electronic device is not connected via one or more of the openings).

Presently, there is a need for methods, systems, and apparatus for inhibiting EMI emissions of electronic assemblies, such as scalable electronic assemblies, having enclosures with one or more openings.

SUMMARY OF THE INVENTION

According to one aspect of the invention a computer system is provided. The computer system includes an electronic assembly having an enclosure, a first access opening defined by the enclosure, and a second access opening defined by the enclosure. A device is coupled to the electronic assembly via the first access opening. A shield is coupled to the electronic assembly and positioned to cover the second access opening defined by the enclosure, the shield being configured to inhibit electromagnetic interference emissions associated with the electronic assembly through the second access opening.

According to another aspect of the invention a shield is provided for use with an enclosure to inhibit electromagnetic interference emissions from the enclosure. The shield includes a cover portion and a plurality of extensions adjacent the cover portion, the extensions together at least partially defining a channel extending along at least a portion of the cover portion. The channel has substantially parallel boundaries, and the channel is configured to receive a portion of the enclosure and to slidably engage the enclosure such that, when engaged, the cover portion inhibits electromagnetic interference emissions from the enclosure.

A method in accordance with an aspect of the invention is also provided for inhibiting electromagnetic interference emissions from an enclosure. The method includes aligning a plurality of extensions of a shield with a portion of the enclosure and sliding the extensions into engagement with the portion of the enclosure until the shield covers an opening in the enclosure, thereby inhibiting electromagnetic interference emissions from the enclosure through the opening.

BRIEF DESCRIPTION OF THE DRAWINGS

Exemplary embodiments of this invention will be described with reference to various figures selected for illustration of those exemplary embodiments, with like elements having identical numbers. When a plurality of similar elements are present, a single reference numeral may be assigned to the plurality of similar elements with a small letter designation referring to specific elements. When referring to the elements collectively or to a non-specific one or more of the elements, the small letter designation may be dropped. It will be appreciated that this invention is not limited to the exemplary embodiments selected for illustration in the figures, of which.

DETAILED DESCRIPTION OF THE INVENTION

Exemplary aspects of the invention will now be described with reference to the Figures. It will be appreciated that variations and modifications of the exemplary embodiments illustrated and described herein may be made without departing from the scope of this invention. For example, the materials, sizes, proportions, and configurations of the illustrated embodiments can be changed, and the illustrated embodiments are not rendered to any specific proportion or scale.

Referring generally to the Figures, an exemplary computer system 100 includes an electronic assembly 102 having an enclosure 200, a first access opening 208a defined by the enclosure 200, and a second access opening 208d defined by the enclosure 200. A device 104 is coupled to the electronic assembly 102 via the first access opening 208a. A shield 106 is coupled to the electronic assembly 102 and positioned to cover the second access opening 208d defined by the enclosure 200, the shield 106 being configured to inhibit electromagnetic interference emissions associated with the electronic assembly 102 through the second access opening 208d.

An exemplary shield 106 for use with an enclosure 200 to inhibit electromagnetic interference emissions from the enclosure 200 includes a cover portion 302 and a plurality of extensions 304 adjacent the cover portion 302, the extensions 304 together at least partially defining a channel 306 extending along at least a portion of the cover portion 302, the channel 306 having substantially parallel boundaries. The channel 306 is configured to received a portion 206 of the enclosure 200 and to slidably engage the enclosure 200 such that, when engaged, the cover portion 302 inhibits electromagnetic interference emissions from the enclosure 200.

Figure 4:
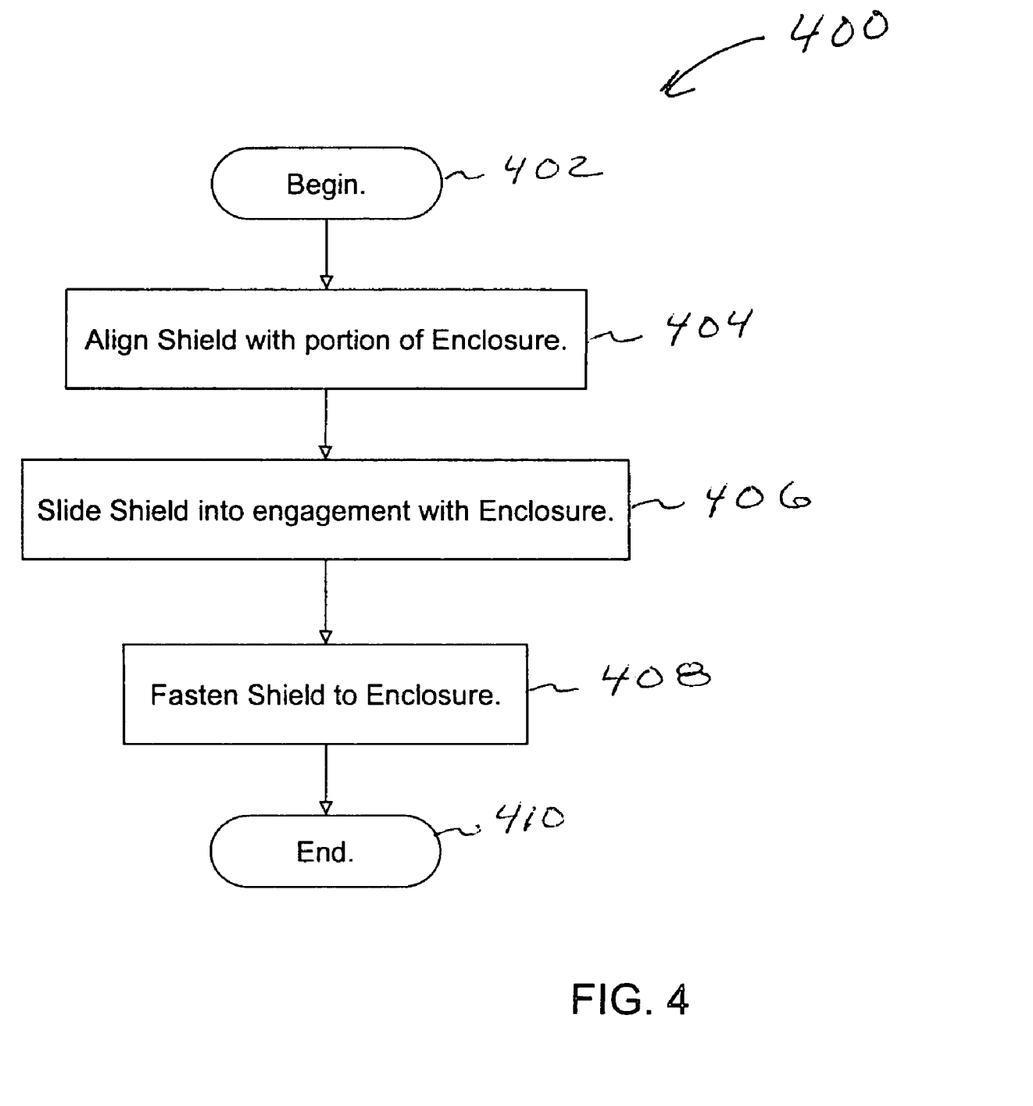
FIG. 4 is a flow chart of an exemplary method for inhibiting electromagnetic interference emissions according to aspects of this invention.

An exemplary method 400 for inhibiting electromagnetic interference emissions from an enclosure 200 includes aligning a plurality of extensions 304 of a shield 106 with a portion 206 of the enclosure 200 (block 404) and sliding the extensions 304 into engagement with the portion 206 of the enclosure 200 until the shield 106 covers an opening 208 in the enclosure 200 (block 405), thereby inhibiting electromagnetic interference emissions from the enclosure 200 through the opening 208.

Figure 1:
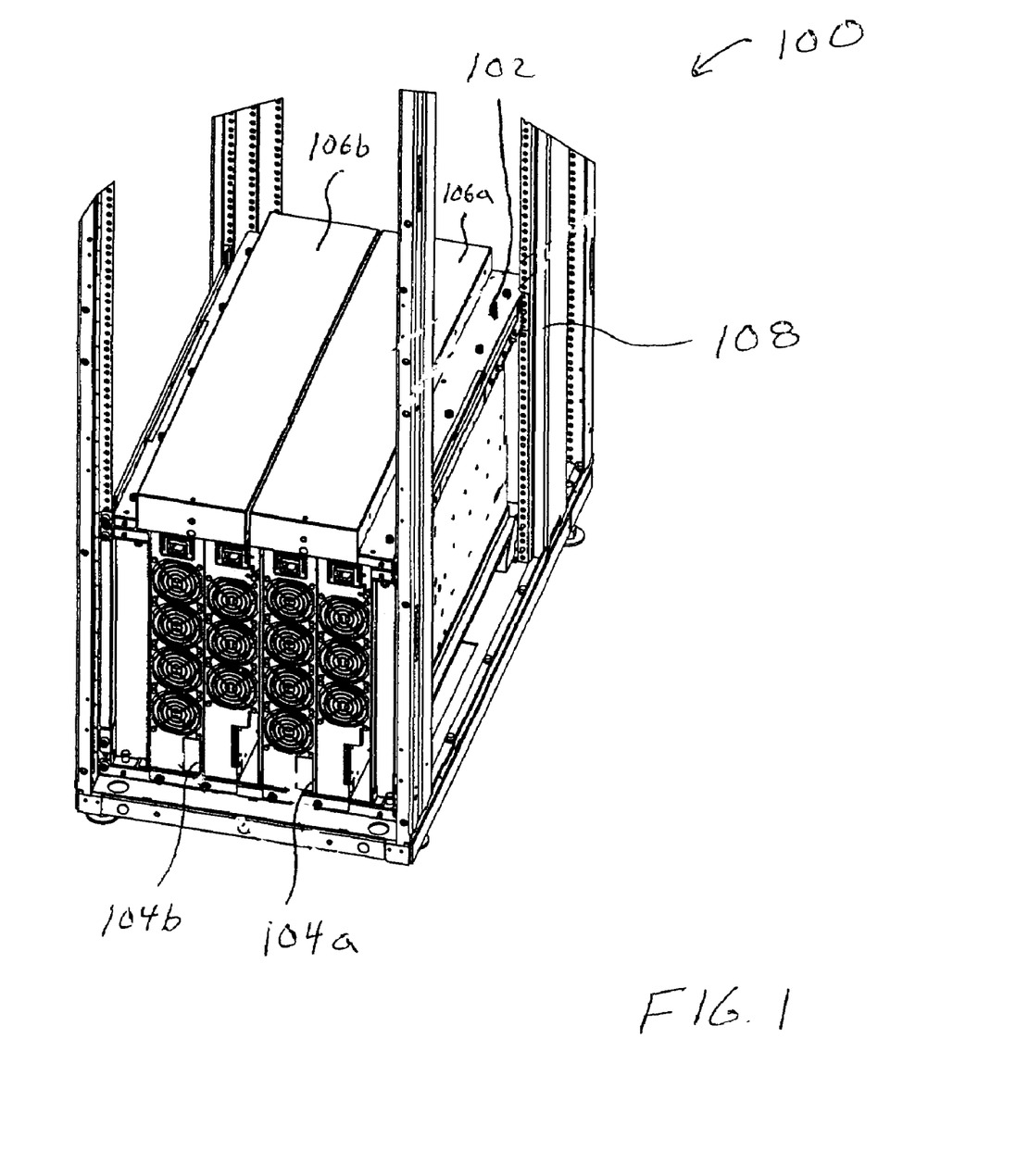
FIG. 1 is a top perspective view of an exemplary embodiment of a computer system according to aspects of this invention.

Referring now to the Figures in detail, FIG. 1 depicts an exemplary computer system 100. The computer system 100 includes an electronic assembly 102 for receiving one or more electronic devices 104a, b, such as a processor module. In addition, the computer system 100 includes one or more shields 106a, b coupled to the electronic assembly 102 to inhibit electromagnetic interference emissions associated with the electronic assembly 102 resulting from electrical components within the electronic devices 104 or within the electronic assembly 102 itself.

The illustrated electronic assembly 102 is mounted within a conventional rack 108 and is configured to receive four electronic devices 104, i.e., two positioned below the electronic assembly 102 (as illustrated) and two positioned above the electronic assembly 102 (not shown). The electronic devices 104 are coupled to the electronic assembly 102 through access openings in the electronic assembly, which are described in detail below.

When the electronic assembly 102 is not at full capacity (e.g., when less than four electronic devices 104 are present in the illustrated embodiment), unused access openings intended for receiving electronic devices 104 become potential sources of EMI emissions. Shields 106 are therefore positioned over unused access openings in the electronic assembly 102 to inhibit EMI emissions from the computer system 100 through these unused access openings.

Figure 2A:
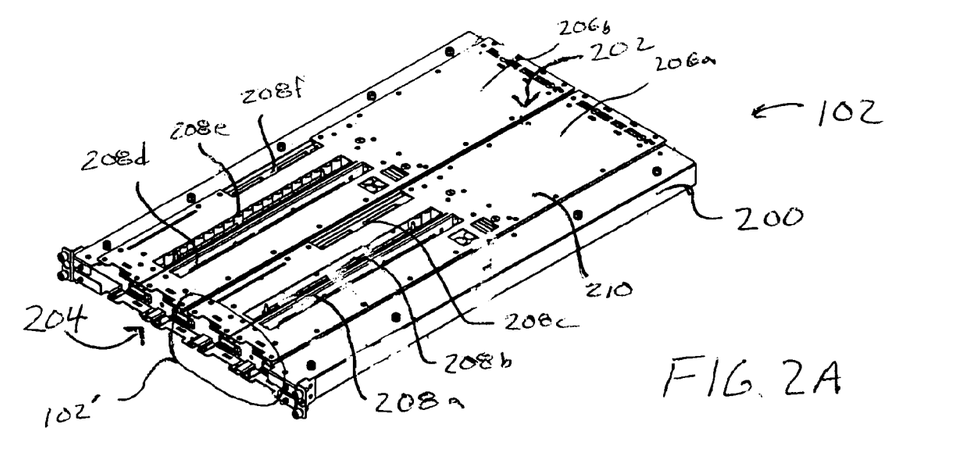
FIG. 2A is a top perspective view of an exemplary embodiment of an electronic assembly according to aspects of this invention.

FIG. 2A depicts an exemplary electronic assembly 102. The electronic assembly 102 includes an enclosure 200 having a first surface 202 and a second surface 204 opposite the first surface 202. The first surface 202 is configured to receive or to be positioned adjacent to two electronic devices 104. Likewise, the second surface 204, which is essentially identical to the first surface 202, is configured to receive or to be positioned adjacent to two electronic devices.

Enclosure portions on the surfaces 202, 204 of the enclosure 200 (represented by enclosure portions 206a and 206b on the first surface 202 of the enclosure 200) are each configured to receive or to be positioned adjacent to an electronic device 104 (FIG. 1). Each enclosure portion 206 includes at least one access opening (represented by access openings 208a–c in enclosure portion 206a and access openings 208d–f in enclosure portion 206b) through which electronic devices may be electrically coupled to the electronic assembly 102.

The enclosure portion 206a is defined by a plate 210 having substantially parallel boundaries. In an exemplary embodiment, the electronic assembly is an interconnect for interconnecting two or more electronic devices that includes at least one connector assembly (not shown) routed between a first access opening in one enclosure portion (e.g., access opening 208a) and a second access opening in another enclosure portion (e.g., access opening 208e), which essentially acts as an EMI conduit.

Figure 2B:
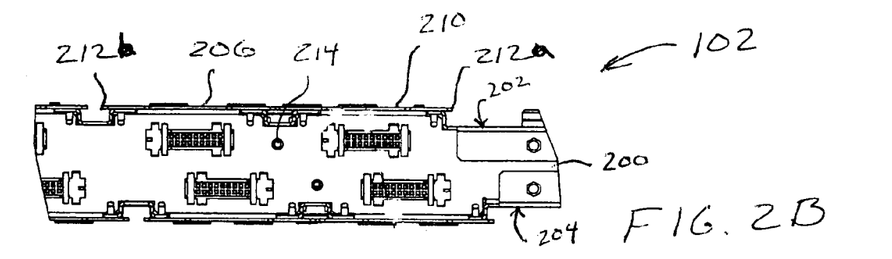
FIG. 2B is a partial end view of the exemplary electronic assembly of FIG. 2A.

FIG. 2B depicts an exploded end portion 102' of the electronic assembly 102 of FIG. 2A. The illustrated portion 102' depicts an end portion of the electronic assembly 102 in an area corresponding to an enclosure portion 206. The enclosure portion 206 is defined by a pair of edges 212 of the plate 210, which extend along the first surface 202 of the enclosure 200 substantially parallel to one another. As will be described in greater detail below, a shield 106 (FIG. 1) is configured to receive the enclosure portion 206 defined by the edges 212 for slidable engagement with the enclosure 200.

A mating fastener 214, which will also be described in further detail below, is provided on the enclosure 200. In an exemplary embodiment, the mating fastener 214 is an internally threaded cylinder coupled to the enclosure electronic assembly 102. Other known threaded or non-threaded fasteners may be substituted.

Figures 3A, 3B:
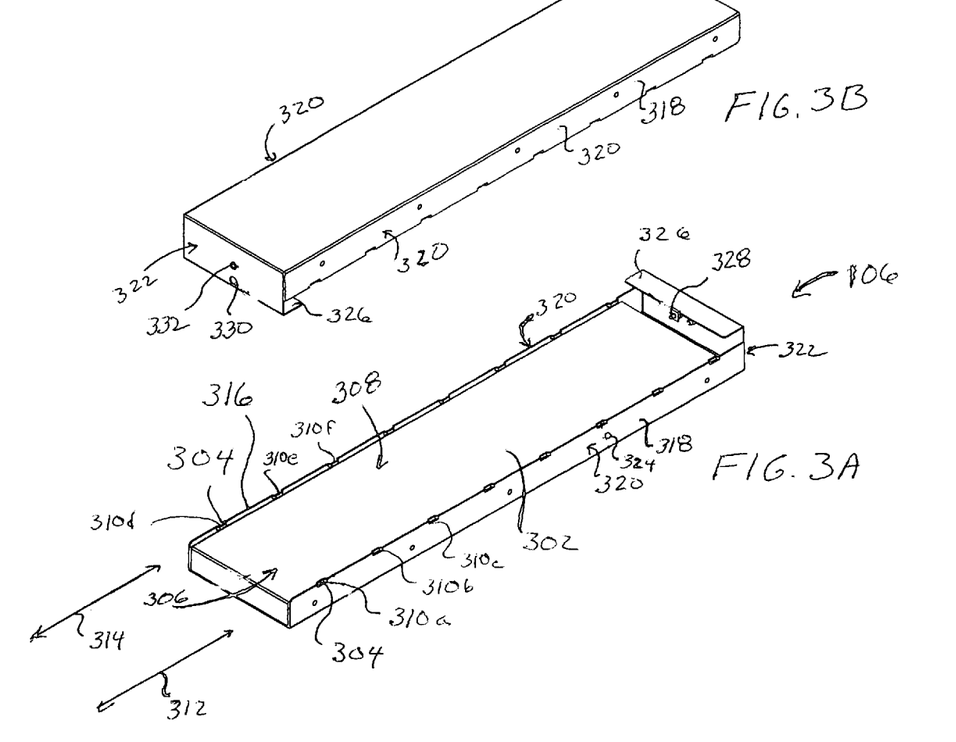
FIG. 3A is a perspective bottom view of an exemplary shield according to aspects of this invention.
FIG. 3B is a perspective top view of the exemplary shield of FIG. 3A.

FIGS. 3A–3E depict various views and components of an exemplary shield 106 for use with the present invention. As depicted in FIG. 3A, the shield 106 includes a cover portion 302 and a plurality of extensions 304 adjacent the cover portion 302. Together, the extensions 304 at least partially define a channel 306 having substantially parallel boundaries extending along at least a portion of a mating surface 308 of the cover portion 302 for receiving an enclosure portion 206 (FIGS. 2A and 2B) of the enclosure 200, e.g., by gripping the edges 212 a, b (FIG. 2A) of the enclosure portion 206. The extensions 304 are configured and positioned relative to the mating surface 308 of the cover portion 302 such that the mating surface covers access openings 208 (FIG. 2) corresponding to the enclosure portion to which the shield 106 is attached.

In an exemplary embodiment, the extensions 304 comprise a plurality of detents (represented by detents 310a–e) with a first set of detents extending along a first axis 312 and a second set of detents extending along a second axis 314 spaced from the first axis 312. Each of the detents 310 is separated by a detent space (represented by portion 316), which may be uniform or non-uniform along the length of the channel 306. In an alternative exemplary embodiment, the extension comprises a pair of spaced slide rails 336 (see FIG. 3C) that extend along respective ones of the first and second axes 312 and 314.

In the illustrated embodiment, the shield 106 further includes an outer cover portion 318 coupled to the cover portion 302. The outer cover portion 318 includes a pair of side portions 320 and an end portion 322. In the illustrated embodiment, the detents 310 are formed within the side portions 320. In addition to providing structure for the extensions 304, the side portions 320, which extend beyond the mating surface 308 of the cover portion 302, offer further EMI shielding for EMI emissions that are not fully inhibited by the mating surface 308 of the cover portion 302. The outer cover portion 318 may be coupled to the cover portion 302 using essentially any type of fastener, e.g., rivets (represented by rivet 324), or by snap fit engagement or other known coupling means.

The illustrated shield 106 further includes a fastener mounting surface 326 coupled to the end cover portion 322 and a fastener 328 mounted on the fastener mounting surface 326. The fastener 328 is configured for mating with the mating fastener 214 (FIG. 2B) once the shield 106 is at least substantially engaged with an enclosure portion of the enclosure. In an exemplary embodiment, the fastener 328 is a captive screw coupled to the fastener mounting surface 326.

FIG. 3B is a top perspective view of the shield 106. This view of the shield 300 illustrates that the end cover portion 322 includes an access hole 330 and another fastener 332. The access hole 330 provides an opening within the outer cover portion 318 through which the fastener 328 can be accessed. For example, a screw driver may be inserted into the access hole 330 to turn a captive screw, which is optionally used as a fastener 328, to drive the captive screw into engagement with the mating fastener 214 (FIG. 2B). The other fastener 332 provides a means for coupling to another component of a system. For example, the fastener 332 may be a clip insert which captures a pin on a trim piece (not shown).

Figure 3C:
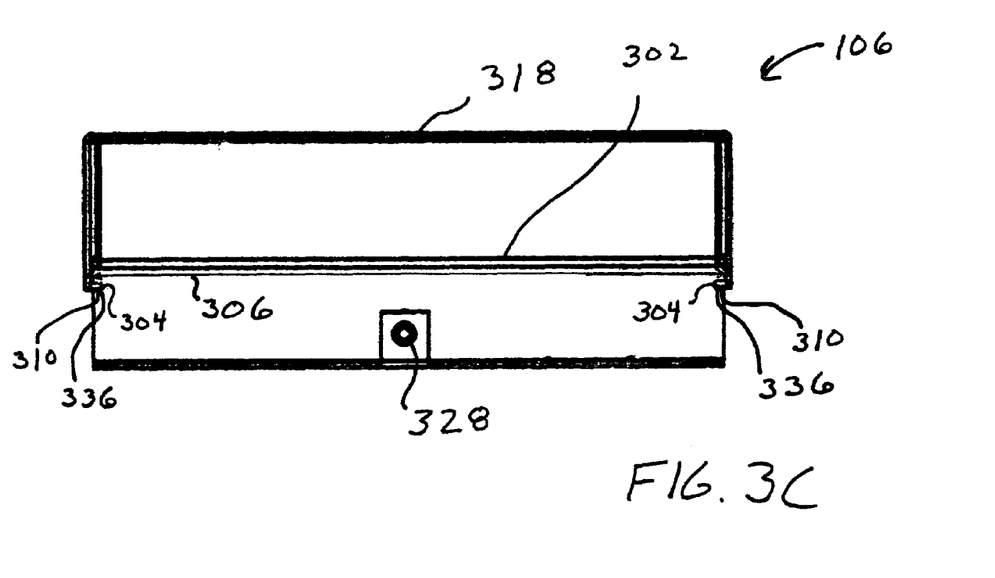
FIG. 3C is an end view of the exemplary shield of FIG. 3A.

FIG. 3C depicts an end view of the shield 106. The extensions 304, which are adjacent the cover portion 302, define the channel 306 for receiving an enclosure portion. The extensions 304 may be comprised of detents 312 or one or more slide rails 336.

Figures 3D, 3E:
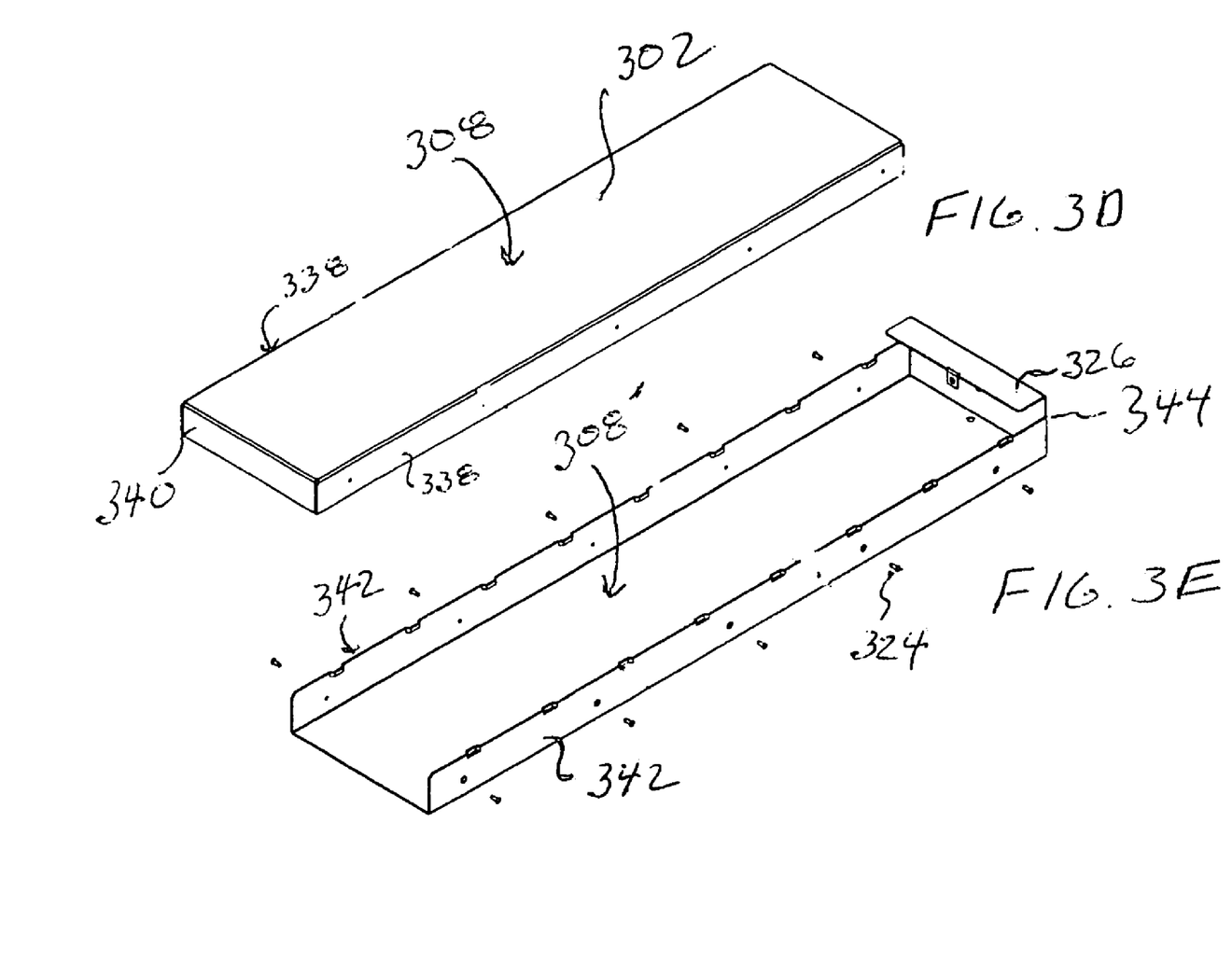
FIG. 3D is a perspective view of an exemplary cover portion of the exemplary shield of FIG. 3A.
FIG. 3E is a perspective view of an exemplary outer cover portion, which together with the exemplary cover portion of FIG. 3D forms the exemplary shield of FIG. 3A.

FIG. 3D is an illustration of the cover portion 302 of the shield 106. The cover portion 302 includes a pair of side walls 338 and an end wall 340. A mating surface 308 of the cover portion 302 mates with an enclosure portion 206 of the electronic assembly 102 (FIG. 2A) to cover access openings 208 within the enclosure portion 206, thereby inhibiting the emission of EMI from these access openings.

FIG. 3E depicts the outer cover portion 318 of the shield 106. The outer cover portion 318 includes a pair of side walls 342 and an end wall 344. The cover portion 302 may be coupled to the outer cover portion 318 with a plurality of rivets (represented by rivet 324). Alternatively, the cover portion 302 may be coupled to the outer cover portion 318 by snap fit engagement, friction fit, welds or any other known coupling means.

In an alternative embodiment, the illustrated outer cover portion 316 may serve as the cover portion 302. In this embodiment the outer cover portion includes a mating surface 308', which is adjacent the extensions 304 and spaced from the extensions 304 such that the mating surface 308' covers access openings in an enclosure portion engaged by the shield 106.

FIG. 4 depicts exemplary steps for inhibiting emissions of EMI from an enclosure. The steps of FIG. 4 are in reference to FIGS. 1, 2A, 2B, and 3A–E. Processing begins at block 402 with the alignment of the plurality of extensions of a shield with an enclosure portion of the enclosure at block 404. In an exemplary embodiment, one or more extensions 304 along a first axis 312 of the shield 106 are aligned with a first edge 212a of the enclosure portion 206 and one or more extensions 304 along a second axis 314 are aligned with a second edge 212b of the enclosure portion 206.

At block 406 the shield 300 is slid into engagement with the enclosure portion of the enclosure, such that a mating surface of the shield covers an opening in the enclosure, thereby inhibiting electromagnetic interference emissions from the enclosure through the opening. In an exemplary embodiment, when the cover portion is slid onto the enclosure portion 204, a mating surface 308 of the cover portion 302 is brought into contact with the enclosure portion 206, thereby covering the access openings 208 within that enclosure portion 204.

At block 408, the shield is fastened to the enclosure. In an exemplary embodiment, once the shield 106 is at least substantially engaged with the enclosure 200, a fastener 328 on the shield 106, e.g., a screw or other known fastener, is connected to a mating fastener 214 on the enclosure 200, e.g., an internally threaded cylinder. Processing then ends at block 410. It will be readily apparent to those of skill in the art from the above description that the shield may be easily removed from the enclosure by unfastening the fastener from the mating fastener and sliding the shield out of engagement with the enclosure.

Referring back to FIGS. 3A–3E, in an exemplary embodiment, the cover portion 302 and the outer cover portion 318 of the cover 106 are fabricated from zinc plated steel. Other types of suitable cover materials for use in forming the cover 106 such as steel mesh will be understood by those of skill in the art from the description herein. Standard sheet metal forming equipment (not shown) bends and forms the zinc plated steel into the cover portions 302, 318. The cover 106 is painted for appearance purposes, but masked to leave the zinc plated surface exposed in areas where the cover portion mates with the electronic assembly 200 (FIG. 2) to enable good electrical contact there between. The cover portion 302 and the outer cover portion 318 are riveted together in a conventional manner to form the cover 106.

The cover 106 is especially useful for inhibiting EMI emissions of electronic assemblies, such as scalable electronic assemblies, having enclosures with one or more openings. The shield 106 is configured to slidably engage portions of electronic assemblies containing access openings, which are potential sources of EMI emissions. Through slidable engagement, the cover can quickly and easily be added to and removed from the electronic assemblies. Thus, EMI emissions from electronic assemblies can be easily inhibited while maintaining ease of scalability.

In addition, the cover 106 exhibits superior rigidity and improved aesthetic features. The assembly of the cover 106 from the cover portion 302 and the outer cover portion 318 provides rigidity to the cover 106. In addition, the two piece construction enables increases in the height of the cover 106 for aesthetic purposes, e.g., to receive a trim piece, while minimizing the weight of the cover 106.

While preferred embodiments of the invention have been shown and described herein, it will be understood that such embodiments are provided by way of example only. Numerous variations, changes and substitutions will occur to those skilled in the art without departing from the scope of the invention. Accordingly, it is intended that the appended claims cover all such variations as fall within the scope of the invention.

What is claimed:

1. A computer system comprising:
   an electronic assembly having an enclosure, a first access opening defined by said enclosure, and a second access opening defined by said enclosure;
   a device coupled to said electronic assembly via said first access opening; and
   a shield coupled to said electronic assembly and positioned to cover said second access opening defined by said enclosure, wherein said shield includes a cover portion having a substantially planar mating surface and a plurality of extensions adjacent said cover portion, said extensions together at least partially defining a channel extending along at least a portion of said cover portion, said channel having substantially parallel boundaries, said channel being configured to received a portion of the enclosure and to slidably engage the enclosure such that, when engaged, said substantially planar mating surface of said cover portion contacts said portion of the enclosure and covers said second access opening to inhibit electromagnetic interference emissions from the enclosure.

2. The computer system of claim 1, wherein said first and second access openings are defined along a common surface of the enclosure.

3. The computer system of claim 1, wherein said first and second access openings are defined along different surfaces of the enclosure.

4. The computer system of claim 1, wherein said electronic assembly is an interconnect configured to receive said device, said interconnect having a connector assembly routed between said first and second access openings.

5. The computer system of claim 1, wherein said plurality of extensions comprise:
   a first slide rail; and
   a second slide rail spaced from said first slide rail and substantially parallel to said first slide rail to define said channel therebetween.

6. The computer system of claim 1, wherein said plurality of extensions comprises:
   a first plurality of substantially aligned detents positioned along a first axis; and
   a second plurality of substantially aligned detents spaced from the first plurality of substantially aligned detents and positioned along a second axis substantially parallel to the first axis to define said channel there between.

7. The computer system of claim 1, wherein said plurality of extensions are coupled to said cover portion.

8. The computer system of claim 1, wherein said plurality of extensions extend from said cover portion.

9. The computer system of claim 1, further comprising:
   a fastener coupled to the cover portion to secure the cover portion to the enclosure.

10. The computer system of claim 1, further comprising:
   an outer cover portion coupled to said cover portion, said outer cover portion spaced from and substantially parallel to said cover portion, said outer cover portion and said cover portion together defining a space there between.

11. The computer system of claim 1, wherein the shield is rigid.

* * * * *